(12) United States Patent
Hinnen

(10) Patent No.: US 10,879,878 B1
(45) Date of Patent: Dec. 29, 2020

(54) DROP-IN SOLID-STATE RELAY

(71) Applicant: Altec Industries, Inc., Birmingham, AL (US)

(72) Inventor: Tyler Hinnen, Kansas City, KS (US)

(73) Assignee: Altec Industries, Inc., Birmingham, AL (US)

( * ) Notice: Subject to any disclaimer, the term of this patent is extended or adjusted under 35 U.S.C. 154(b) by 0 days.

(21) Appl. No.: 16/715,392

(22) Filed: Dec. 16, 2019

(51) Int. Cl.
| | |
|---|---|
| *H01H 9/54* | (2006.01) |
| *H03K 3/012* | (2006.01) |
| *H02B 1/00* | (2006.01) |
| *H02M 7/217* | (2006.01) |
| *H02M 7/06* | (2006.01) |
| *H03K 17/687* | (2006.01) |
| *H01H 9/00* | (2006.01) |

(52) U.S. Cl.
CPC .............. *H03K 3/012* (2013.01); *H01H 9/00* (2013.01); *H02B 1/00* (2013.01); *H02M 7/06* (2013.01); *H02M 7/217* (2013.01); *H03K 17/687* (2013.01); *H01H 2009/545* (2013.01)

(58) Field of Classification Search
CPC ........ H03K 3/012; H03K 17/687; H02B 1/00; H02M 7/06; H02M 7/217; H01H 9/00; H01H 2009/545
See application file for complete search history.

(56) References Cited

U.S. PATENT DOCUMENTS

| | | | |
|---|---|---|---|
| 3,678,291 A | 7/1972 | Coe | |
| 5,138,177 A | 8/1992 | Morgan et al. | |
| 6,902,967 B2 * | 6/2005 | Beasom | H01L 27/0921 257/E27.063 |
| 7,642,502 B2 * | 1/2010 | Tajiri | H03K 17/785 250/214 R |
| 7,933,104 B2 * | 4/2011 | Bauer | H01H 47/004 361/93.1 |
| 8,084,894 B2 * | 12/2011 | Chen | H03K 17/691 307/140 |
| 8,422,182 B2 * | 4/2013 | Boudet | H03K 17/0822 361/91.1 |
| 8,704,409 B2 * | 4/2014 | Owens | H03K 17/567 307/125 |
| 8,947,155 B2 * | 2/2015 | Takahashi | H03K 17/785 327/434 |

* cited by examiner

*Primary Examiner* — Dinh T Le
(74) *Attorney, Agent, or Firm* — Erise IP, P.A.

(57) ABSTRACT

Embodiments of the invention provide for a drop-in solid-state relay replacement for current standard relays. The drop-in solid-state relay may comprise receiving an input power and actuating at least one transistor to provide power to operational equipment. In some embodiments, an optical isolator may be disposed at an output driver stage of the relay circuit to provide electrical isolation between the input stage and the output stage. The drop-in solid-state relay may provide low input voltage, low heat, no noise, and not produce fly-back.

20 Claims, 6 Drawing Sheets

DROP-IN SOLID-STATE RELAY

BACKGROUND

1. Field

Embodiments of the invention are broadly directed to a solid-state relay. More specifically embodiments of the invention are directed to a drop-in solid-state relay for power distribution systems.

2. Related Art

Power distribution modules utilize relays to direct current to various parts of systems. Typical relays require relatively large amounts of electrical energy to activate (switch). Typical relays are also unreliable. A magnetic field associated with the metal coil of a standard relay may collapse causing fly-back. When typical relays are turned off, for a short time the voltage on the contacts may be reversed, which causes fly-back. Fly-back may cause damage to electronic modules and spurious electro-magnetic emissions. Further, typical standard relays have moving parts that may wear and break and need replacing. Typical standard relays also cause noise that may be eliminated with the drop-in solid-state relay.

What is needed is a drop-in solid-state relay that may be form fitting to current standard relay plugs and meet operational standards for power requirements and equipment in use receiving signals through the relay. The drop-in solid-state relay may eliminate, or not produce, fly-back by not relying on a magnetic field and inductive coil to move an armature as in a typical relay. Further, the drop-in solid-state relay may increase reliability and eliminate noise by eliminating moving parts. Further still, the solid-state relay may reduce the power required to actuate the relay by up to 95% by using electrical energy to trigger a transistor rather than using magnetic energy to move the armature as in a typical relay.

SUMMARY

Embodiments of the invention solve the above-described problems by providing a solid-state relay that has no moving parts, makes no sound, does not produce fly-back, and reduces the required power to operate the relay. In particular, in a first embodiment, the invention includes an optically-isolated circuit of a drop-in solid-state relay for actuating at least one transistor and sending power from an input to an output driver stage for operation of an output stage. In some embodiments, the input stage comprises a first pin connected to a first power source, a second pin connected to ground, and at least one diode disposed between the first pin and the second pin. In some embodiments, an output driver stage comprises an optical isolator comprising a light source and a sensor separated by a space, wherein the light source emits light when a first current is received from the power source, wherein the sensor receives the light and generates a voltage when the light is received. An output stage comprises a third pin receiving a second current, a fourth pin, and the at least one transistor configured to actuate when a voltage is detected from the output driver stage allowing the second current to pass from the third pin to the fourth pin.

A second embodiment is directed to an optically-isolated circuit of a drop-in solid-state relay for actuating a plurality of transistors and sending power from an input to an output driver stage for operation of an output stage, the circuit comprising a first pin connected to a power source, a second pin connected to ground, at least one diode disposed between the first pin and the second pin, and an optical isolator comprising a light source and a sensor separated by a space, wherein the light source emits light when a current is received from the power source, wherein the sensor receives the light and generates a voltage when the light is received, wherein the plurality of transistors actuates based on the voltage generated by the sensor.

A third embodiment is directed to a method for actuating at least one transistor of a circuit of a drop-in solid-state relay for sending power from an input pin to an output pin, the method comprising the steps of receiving a first current from a power source, illuminating a light source using the first current, detecting the light from the light source with a light sensor, generating a voltage based on the detected light, actuating the at least one transistor based on the voltage, and sending a second current from the input pin to the output pin.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF DRAWINGS

Embodiments of the invention are described in detail below with reference to the attached drawing figures, wherein.

Figure 1:
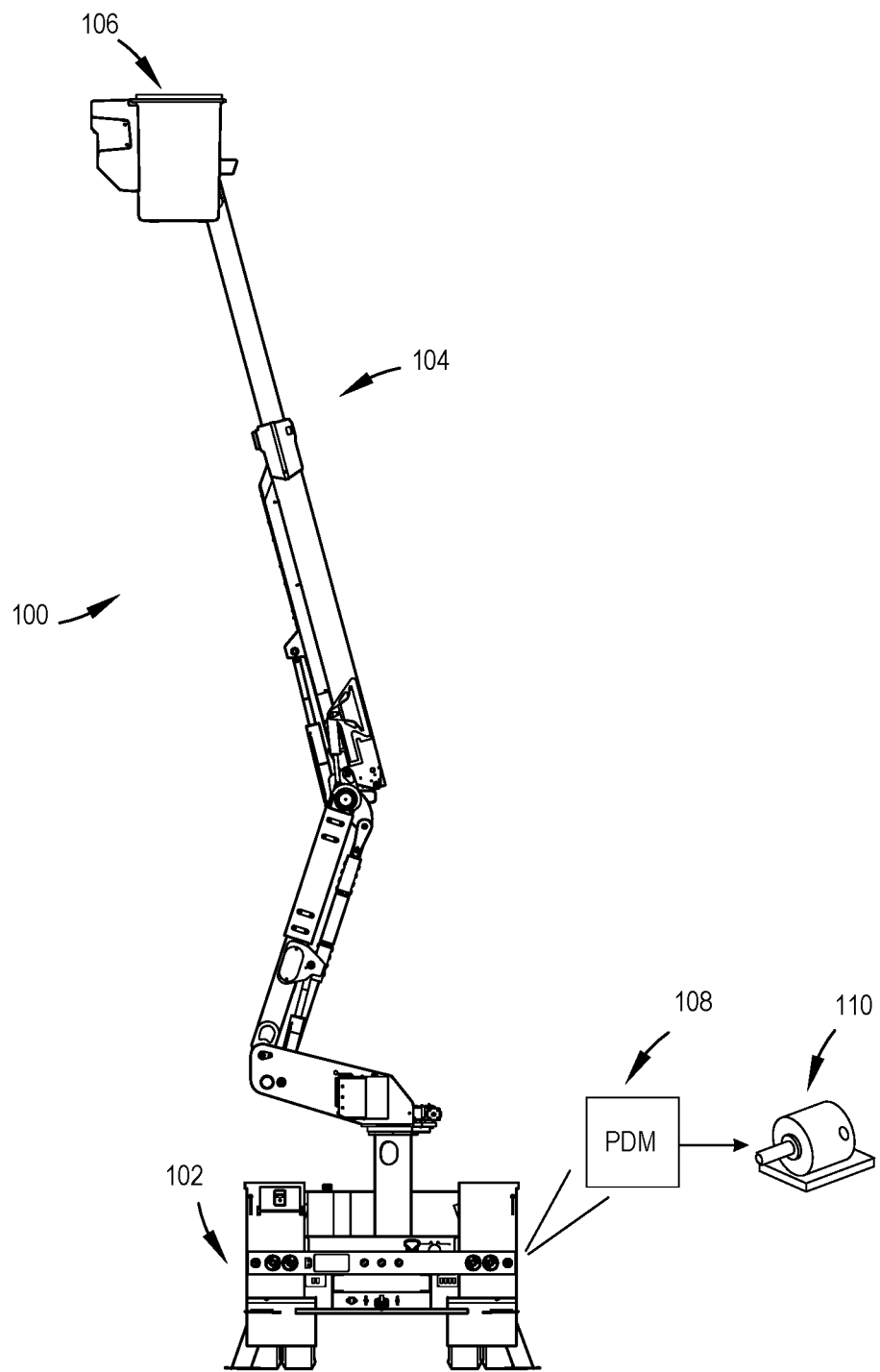
FIG. 1 depicts an exemplary embodiment of an aerial device utilizing a power distribution with the drop-in solid-state relay.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the technology can include a variety of combinations and/or integrations of the embodiments described herein.

Broadly speaking, embodiments of the invention provide a drop-in solid-state relay that has no moving parts, electrically isolates the input from the output, does not produce fly-back, is reliable, and makes no noise. In embodiments of the invention, the drop-in solid-state relay comprises a plurality of diodes, resistors, transistors, and an optical isolator. The drop-in solid-state relay may be used in low and high voltage environments and may be standardized to the meet any automotive standards, particularly, automotive Form Factor A. In some embodiments, the drop-in solid-state relay comprises four-pins and is operational up to 30 amps.

In some embodiments, the drop-in solid-state relay may be used in utility equipment as described herein. However, this exemplary use is not limiting. The drop-in solid-state relay described herein may be used for any power distribution function such as, for example, automotive, industrial, boating, buildings, houses, or any other operation.

FIG. 1 presents an exemplary utility vehicle 100 with a rotatable boom that may be used in embodiments of the invention. The utility vehicle 100 (an exemplary boom truck) generally comprises a base 102 with a boom assembly 104 rotatably mounted thereto. A utility platform 106, which in some embodiments may be a winch hook, a digger derrick, a pole guide, or other tool, is disposed on the boom assembly 104 to provide for the accomplishment of a task by a utility worker.

The base 102 of the utility vehicle 100 is a selectively stabilized platform. In embodiments of the invention, the base 102 is an aerial device base, a crane base, an oilrig, an earth-working machine, an automobile, or a fixed structure. The base 102 provides stability and a counterweight to a load being supported by the boom assembly 104. The base 102 and the aerial platform 106 may comprise control inputs that may be connected to a power distribution module for controlling various operational equipment on the utility vehicle 100.

In some embodiments, the boom assembly 104 and the utility platform 106, as well as any other mechanical functions on the utility vehicle 100 may be operated by a user at the base 102. The user may manipulate a control panel that may be connected to a Power Distribution Module (PDM) 108. The PDM 108 and control panel may include switches for distributing power to various operational equipment such as, for example, ignition, throttles, parking brakes, as well as various electromechanical actuators. In some cases, the power required for actuation of these devices is relatively high thus requiring a high-voltage power source. The high-voltage power source may be an alternator transferring mechanical energy to electrical energy. The mechanical energy source may be, in some embodiments, the engine of the utility vehicle 100 or a peripheral generator. High voltage may be necessary in some cases, however, and embodiments described herein describe a drop-in solid-state relay for use in the PDM 108 that meet low-voltage standards as well as automotive Form Factor A requirements.

Typically, the power to operate the operational equipment comes from the engine of the utility vehicle 100 turning a generator providing the necessary electrical energy. The electrical energy is then distributed to operational equipment 110 through the PDM 108. Circuits within the PDM 108 direct current to the operational equipment 110 when switches are actuated by the user. These switches may be connected to relays that direct the electrical energy to the corresponding operational equipment 110. The drop-in solid-state relay described in embodiments herein may be used as a replacement for old relays. The drop-in solid-state relay described herein may be used for any power distribution system and is not limited to the high-voltage power sources described above. In some embodiments, the drop-in solid-state relay is configured to fit any automotive Form Factor A receiver and may be operational at any voltage and current ranges. In some embodiments, the drop-in solid-state relay may plug into any standard relay receptacle in the PDM 108 and may be designed based on the load capacity for which it is used. In some embodiments, the drop-in solid-state relay may be used to power modules on a vehicle, send signals to standard vehicle chassis modules and custom vehicle chassis modules, be used to signal the PDM itself, or transmit signals to other relays. The relay may be used to power and send signals for any function that may be imagined in relation to embodiments described herein.

Figure 2:
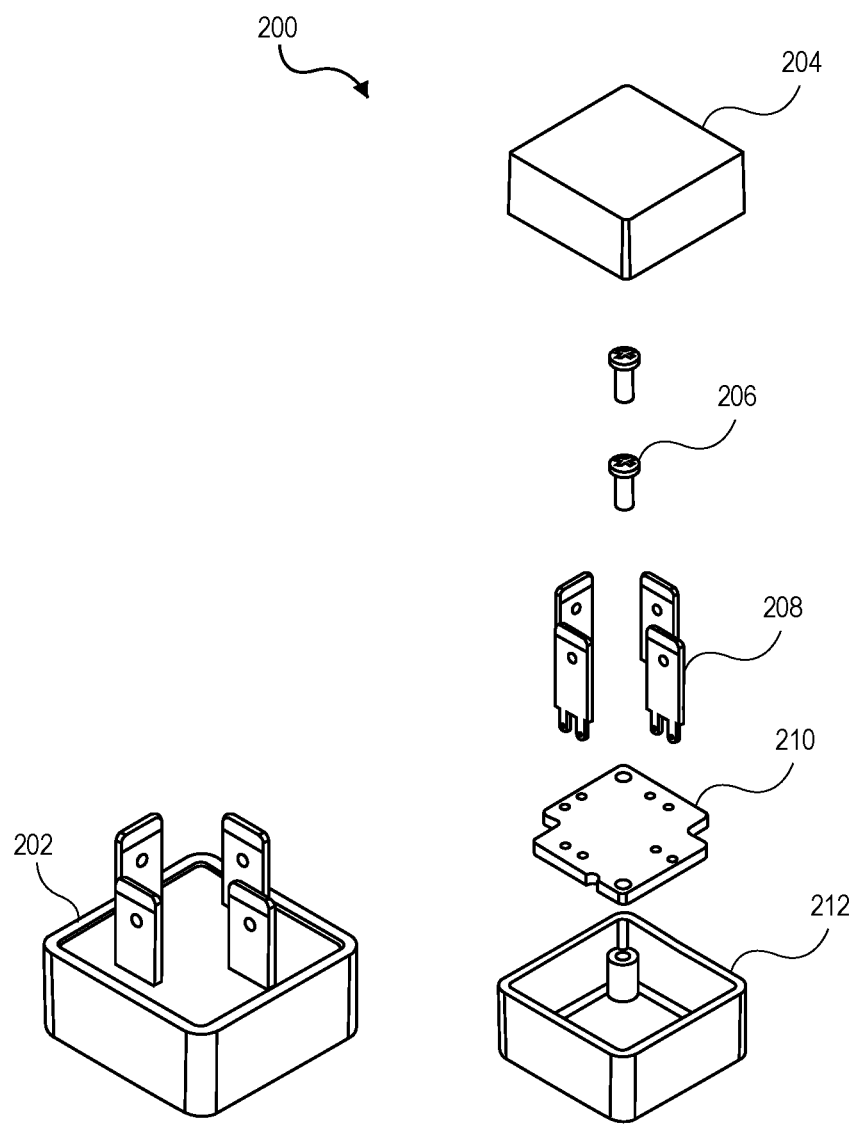
FIG. 2 depicts an exemplary drop-in solid-state relay assembly.

FIG. 2 depicts an exemplary assembly 200 of a drop-in solid-state relay 202 described in embodiments herein. The drop-in solid-state relay 202 may comprise an insulating cover 204, fasteners 206, terminal pins 208, a circuit board 210, and a housing 212. In some embodiments the insulating cover 204 is made of an electrically insulating material such as a polymer, or glass. In some embodiments, the insulating material is epoxy.

In some embodiments, the terminal pins 208 comprise a conductive metal such as, for example, brass, copper, copper alloy, nickel, zinc, gold, tin, and any other conductive metal. The terminal pins 208 may be any size and shape for the intended use. For example, the drop-in solid-state relay 202 may be used for any of the uses provided above. The pin configuration of the drop-in solid-state relay 202 may be form fitting to any of the above described uses including automotive Form Factor A relay socket. In some embodiments, the drop-in solid-state relay comprises four terminal pins 208 that may be configured to plug into any standard relay plug. In some embodiments, there may be two, three, four, or any number of terminal pins 208.

In some embodiments, the circuit board 210 is a standard printed circuit board and may provide a board for embodiments of the circuitry described herein. In some embodiments, a plurality of circuit boards may be used. The assembly 200 may be assembled and configured to drop into any automotive Form Factor A relay socket as a replacement. Further, the drop-in solid-state relay may be configured with four terminal pins 208 and the circuitry configured to function with a maximum current of 30 amps.

Figure 3:
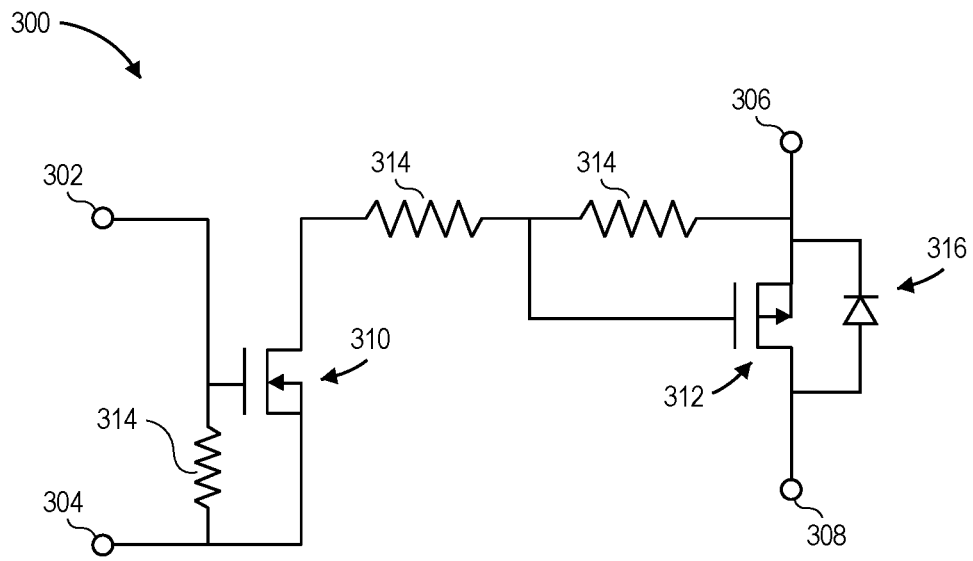
FIG. 3 depicts an embodiment of an interlocked drop-in solid-state relay circuit.

FIG. 3 depicts a circuit 300 that may be provided on the circuit board 210. The circuit 300 comprises a first pin 302 connected to a power source, a second pin 304 connected to ground, a third pin 306 connected to a second power source, and a fourth pin 308 connected to an output, which may be the operational equipment 110. The circuit 300 further comprises a first transistor 310, a second transistor 312, a series of resistors 314, and at least one diode 316. In some embodiments, the first pin 302 may be connected to the power source. The power source may be alternating or direct current and may be received from or generated by a battery, a gas or electric motor, solar cell, or any other device that may be used to generate electricity. If the power source is alternating current the input of the circuit 300 may be configured with a wave rectifier to change the input to direct current. The input wave rectifier is described below in reference to FIG. 5. In some embodiments, the second power source is any combination of the exemplary power sources. In some embodiments, the second power source is the power source and may be provided at a different power level than the power source.

The second pin 304 may be connected to ground. In some embodiments, the second pin must be connected to ground to actuate the first transistor 310. This forces an interlock on the circuit 300 such that the first pin 304 and the second pin 306 must be satisfied. This provides a level of safety that is not typical in the art. Typical relays do not require the second pin 304 to be satisfied. Specifically, typical Form Factor A solid-state relays do not require both pins 302 and 304 to be satisfied. Therefore, when power is applied to the circuit 300, the voltage reaches the second transistor 312 and may actuate the second transistor 312 based on the voltage. In the current embodiment, the first transistor 310 must be satisfied by a supplied voltage. When the power source is connected and an appropriate voltage is supplied, the first transistor 310 is actuated and current is allowed to flow throughout the rest of the circuit 300 beyond the first transistor 310 This can only happen if the second pin 304 is connected to ground. This provides a first check point before powering the circuit 300 and supplying power distribution through the system. Further, ground-side switching is enabled with the configuration provided in the circuit 300 allowing diversity in the operation set up of the circuit.

The first transistor 310 and the second transistor 312, in some embodiments, may be Field Effect Transistors (FETs), Gallium Nitride Field-Effect Transistors (GaN FET), or Metal-Oxide Field-Effect Transistors (MOSFETs). The FETs require the supplied voltage to meet the requirements of the first transistor 310 and the second transistor 312 before actuation of the transistors. Actuation of the second transistor 312 allows current to flow from the third pin 306 to the fourth pin 308.

In some embodiments, the circuit 300 may comprise an optical isolator. The optical isolator may separate the input (first pin 302, second pin 304, and first transistor 310) from the output (third pin 306, fourth pin 308, and second transistor 312). The optical isolator may receive a current from the power source connected at 302 when the transistor 310 is actuated. The optical isolator may illuminate a Light Emitting Diode (LED). A photovoltaic sensor separated from the LED by space may receive the light energy and generate a voltage. The resulting voltage actuates the second transistor 312. Consequently, current is allowed to flow from the third pin 306 to the fourth pin 308. The optical isolator is described in more detail in reference to FIG. 5 below.

The embodiment depicted in FIG. 3 is a single pole, single throw, relay that is not isolated and has both a unidirectional input and has a unidirectional output. In some embodiments, the input may be made bidirectional by adding a full wave rectifier between the first pin 302 and the second pin 304. An embodiment of the full wave rectifier on the input can be viewed and is discussed in detail in reference to FIG. 5 below.

In some embodiments, the first transistor 310 and the second transistor 312 are FETs. More specifically, in some embodiments, the first transistor 310 is an N-channel MOSFET and the second transistor 312 is a P-channel MOSFET. Further, the output may be configured to be bidirectional by using the optical isolator or a charge-pump circuit and changing the P-channel MOSFET to two FETs (N- or P-channel) connected to a common source.

In some embodiments, the first pin 302 may be connected to the source power and may be trigger high for the first transistor 310 and the second pin 304 may be trigger low and connected to ground. In some embodiments, depending on the type of the first transistor 310, the first pin 302 may be trigger low and the second pin 304 may be trigger high. Any combination of the transistors and power and ground pins may be imagined providing that the resulting circuit provides similar functionality to the circuit 300.

Figure 4:
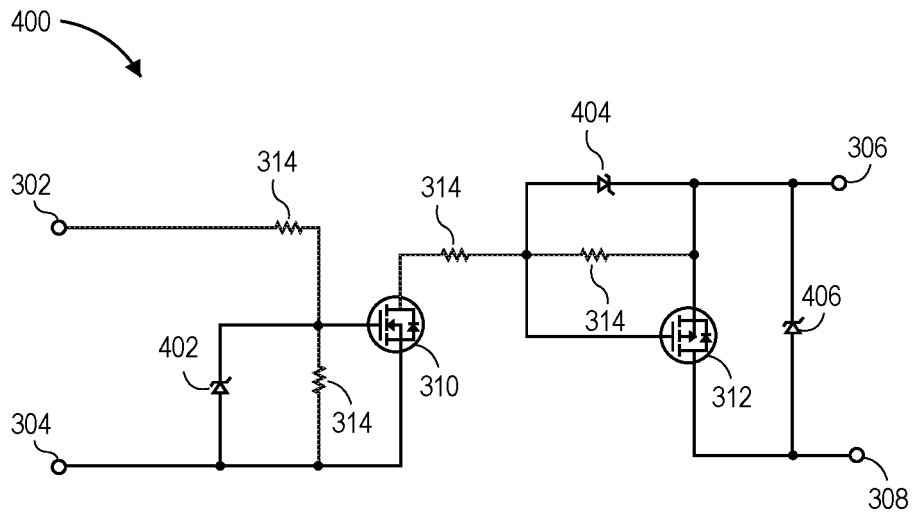
FIG. 4 depicts an embodiment of an interlocked drop-in solid-state relay circuit.

FIG. 4 depicts an alternative circuit 400 to the circuit 300 described in FIG. 3. The alternative circuit 400 is similar to the circuit 300. However, the alternative circuit 400 additionally comprises more resistors 314 and a first Zener diode 402, a second Zener diode 404, and a third Zener diode 406. The first Zener diode 402 is disposed at the input in parallel to one of the resistors 314 and the transistor 310. In general, the Zener diodes allow current in one direction. In the opposite direction the Zener diodes create a barrier to the flow of current below a voltage threshold yet allows current to flow above the threshold. This provides a relief valve for voltage spikes that may damage electrical equipment. The first Zener diode 402 protects the first transistor from voltage spikes and damage. The first Zener diode 402 also may allow for a wider range of voltages to be applied across the first pin 302 and the second pin 304 without causing damage to the relay circuitry. The second Zener diode 404 and the third Zener diode 406 protect the output side and the second transistor 312 from high voltage spikes and fly-back.

Figure 5:
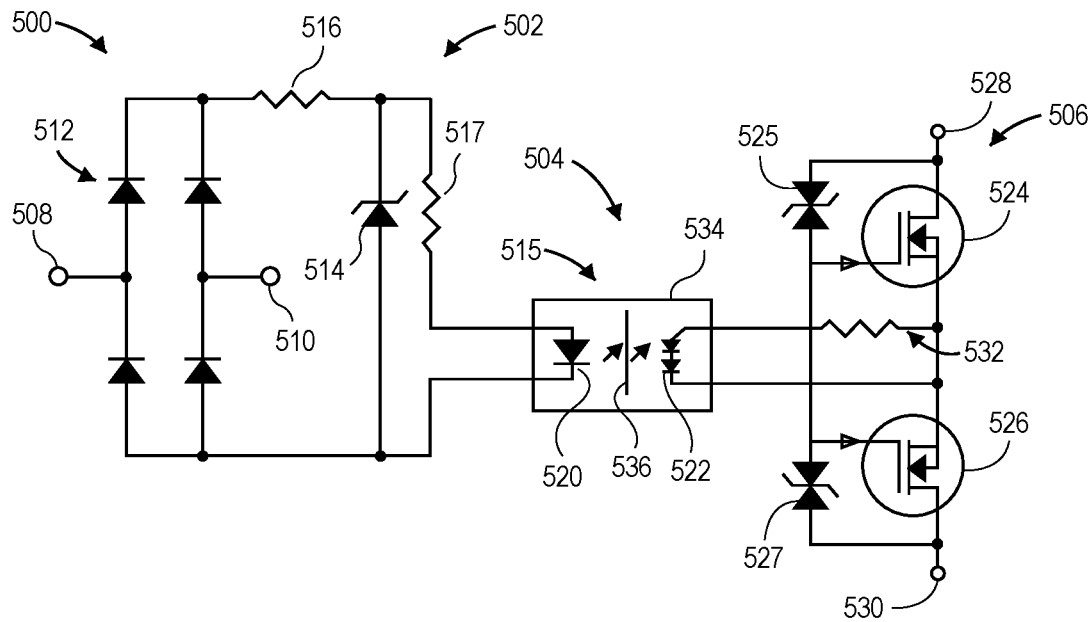
FIG. 5 depicts an embodiment of an optically-isolated drop-in solid-state relay circuit.
Figure 6:
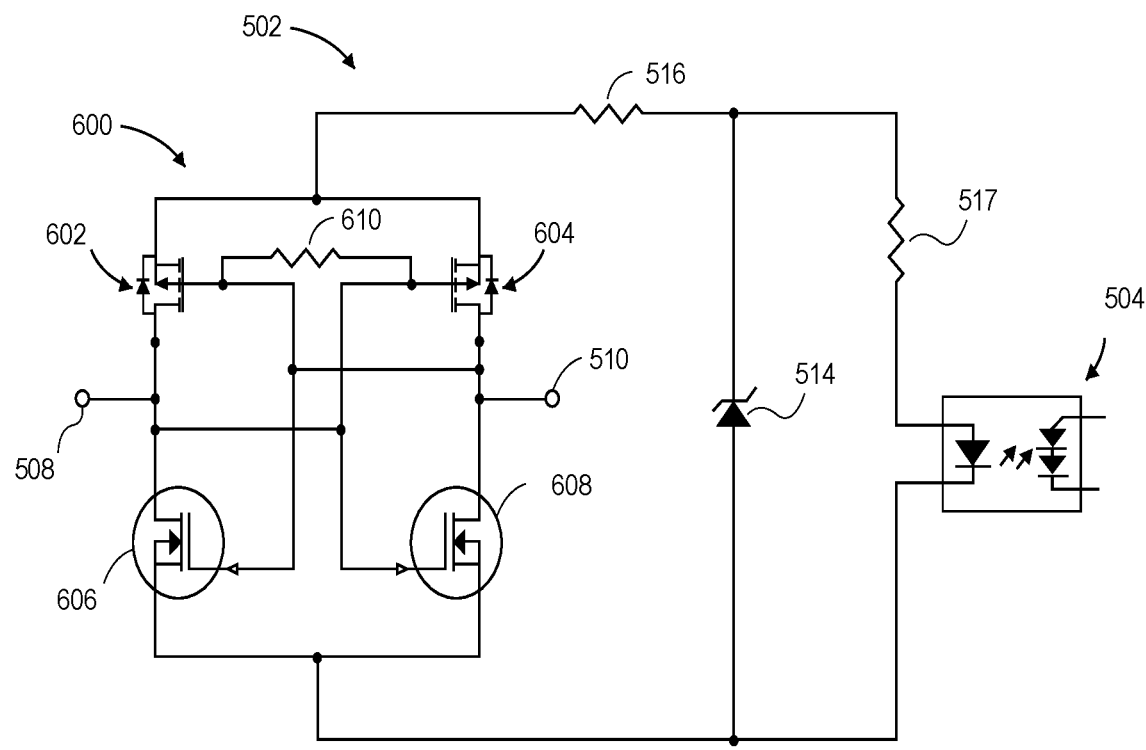
FIG. 6 depicts an embodiment of an input stage and an output driver stage of a drop-in solid-state relay circuit.

Both FIGS. 3 and 4, as well as embodiments described below regarding FIGS. 5 and 6, depict circuits that do not produce fly-back and greatly reduce the current necessary to operate the relays from standard relays. The first transistor 310 and the second transistor 312 may actuate at a lower voltage than standard coil relays. This provides a lower necessary power to operate the drop-in solid-state relay 202 than standard relays. Further, the drop-in solid-state relay 202 has no moving parts, which increases reliability and produces less heat and noise than that associated with standard relays.

FIG. 5 depicts a circuit 500 comprising an input stage 502, an output driver stage 504, and an output stage 506. The input stage 502 functions to connect to a power source and receive and condition a current for the output driver stage 504. The output driver stage 504 transfers the electrical energy to the output stage 506 while electrically isolating the input stage 502 from the output stage 506. The output stage 506 translates a signal from an input (third pin 528) to an output (fourth pin 530) when the signal from the output driver stage 504 is received.

The input stage 502 comprises a first pin 508, a second pin 510, a combination of diodes comprising a wave rectifier 512, at least one Zener diode 514 and a combination of resistors comprising a first resistor 516 and a second resistor 517. The input stage 502 receives a signal from a power source at the first pin 508 and is grounded at the second pin 510. The configuration of the components in the circuit 500 allows for the circuit 500 to be isolated, single pole, single throw, and normally open while the input and the output are bidirectional in this configuration.

In some embodiments, the input stage 502 comprises the wave rectifier 512. The wave rectifier 512 may comprise a combination of diodes for conditioning an incoming alternating current to direct current. This allows the circuit 500 to be connected to a high-current alternating source such as a generator or alternator connected to a motor. Further, the full wave rectifier 512 may also allow for a direct current signal of either positive or negative polarity. This provides more flexibility with trigger signals for direct current applications. In some embodiments, the wave rectifier 512 is not necessary, and the circuit 500 may be connected to a direct current power source such as a battery for example. The wave rectifier 512 provides a constant flow of current to the output driver stage 504 such that the light source 520 may maintain illumination. The constant illumination provides a consistent voltage at the first transistor 524 and the second transistor 526 to close the circuit and allow current to flow from the third pin 528 to the fourth pin 530.

In some embodiments, the input stage 502 comprises the Zener diode 514 and the first input resistor 516 and the second input resistor 517. The Zener diode 514 controls the current flow and allows the current a separate pathway when erroneous high energy spikes occur in the input of the circuit. The Zener diode 514, the first input resistor 516, and the second input resistor 517 may control current flow and protect the components of the output driver stage 504 from damage. In some embodiments, the first input resistor 516 is 680 Ohms with a power rating of 1 Watt and the second input resistor 517 is 100 Ohms.

The output driver stage 504 comprises components for transferring electrical energy to the output stage 506 while isolating the input stage 502 from the output stage 506. Transferring energy while maintaining electrical isolation can be accomplished using an optical isolator 515 In some embodiments, the optical isolator 515 comprises a light source 520 for emitting light when current is received. The light source 520 may be, for example, a Light Emitting Diode (LED), a lamp, or any other light generating device. In some embodiments, the optical isolator 515 further comprises a sensor 522 for receiving the light and generating a voltage. In some embodiments, the LED is an infrared LED. The sensor 522 may be, for example, a phototransistor, a photodiode, a photodiode array, a thyristor such as a Light Activated Silicon Controlled Rectifier (LASCR), or any other sensor that may receive light and generate a voltage and current based on the light received.

In some embodiments, the sensor 522 is a photovoltaic sensor that receives the light emitted by the light source 520 and generates a voltage. The generated voltage may be high enough such that the first transistor 524 and the second transistor 526 actuate to allow current to flow from the third pin 528 to the fourth pin 530.

At the output stage 506, actuating the first transistor 524 and the second transistor 526 closes the circuit supplying electricity to the operational equipment at the fourth pin 530, which may be referred to generally as an operational pin. In some embodiments, the sensor 522 is one of a photodiode, photoresistor, and a thyristor. In some embodiments, as shown, the sensor 522 is a plurality of photo-sensitive diodes. In some embodiments, the sensor 522 may be an N-channel MOSFET. An output resistor 532 may manage current flow and, in some embodiments, is a 680 k Ohm resistor.

The optical isolator 515 may be housed in an opaque housing 534 to prevent unwanted light from inducing a voltage at the sensor 522 and actuating the first transistor 524 and the second transistor 526. In some embodiments, the optical isolator 515 comprises a dielectric barrier 536 for preventing electricity from passing between the input stage 502 and the output stage 506. The dielectric barrier 536 may comprise an electrically insulating material that is disposed between the light source 520 and the sensor 522. The dielectric barrier 536 may be made of a material such as a polymer or glass that may prevent electric energy from crossing but may allow light to pass.

The configuration of the circuit 500 allows a high voltage to be applied at the third pin 528 while only a small amount of power is necessary at the first pin 508. Only a small amount of current is necessary to illuminate the light source 520 such that a voltage is generated at the sensor 522. Once the light source 520 is illuminated the small voltage induced at the sensor 522 causes the first transistor 524 and the second transistor 526 to actuate. Therefore, a relatively low power is needed at the input stage 502 to operate the drop-in solid-state relay 202 as compared to standard relays. In some embodiments, the photo-isolator is operational using 7-9 volts.

In some embodiments, a first transient-voltage suppression (TVS) diode 525 and a second TVS diode 527 are disposed at the output stage 506. In some embodiments, the first transistors 524 and the second transistor 526 stop current flow and a voltage spike across the output of the circuit 500 may be present. This is known as flyback. Generally, the first TVS diode 525 and the second TVS diode 527 may produce electrical energy to the gates of the first transistor 524 and the second transistor 526 when the voltage across the diodes exceeds the avalanche breakdown voltage. This may cause the transistors to turn back on and effectively clamp the output voltage. Consequently, the energy stored in the inductive loads is shed as heat in the transistors at a controlled voltage instead of producing a high-voltage spike which can damage the transistors or other circuitry. The first TVS diode 525 and the second TVS diode 527 may not be present and the circuit 500 may be functional without the diodes.

FIG. 6 depicts an embodiment of the input stage 502 and the output driver stage 504 of the drop-in solid-state relay 202 circuit. In some embodiments, the input stage 502 may be configured with a combination of transistors to act as an ideal diode full wave rectifier 600. A first input transistor 602 and a second input transistor 604 may be enhancement insulated gate type transistors that condition the current for the output driver stage 504. A third input transistor 606 and a fourth input transistor 608 may be depletion insulated gate type transistors that block the back current. The ideal diode full wave rectifier 600 including the resistor 610 depicted in FIG. 6 may be configured such that the current to the output driver stage 504 is direct current while blocking the back current as the wave rectifier 512 does in the embodiments described above. The use of the transistors to create the ideal diode full wave rectifier 600 may provide a low forward voltage drop across the ideal diode full wave rectifier 600 thus requiring less power to operate the circuit than the wave rectifier 512 in FIG. 5. Using the ideal diode full wave rectifier 600 configuration provides energy savings and allows relatively small operational power at the input stage 502.

Figure 7:
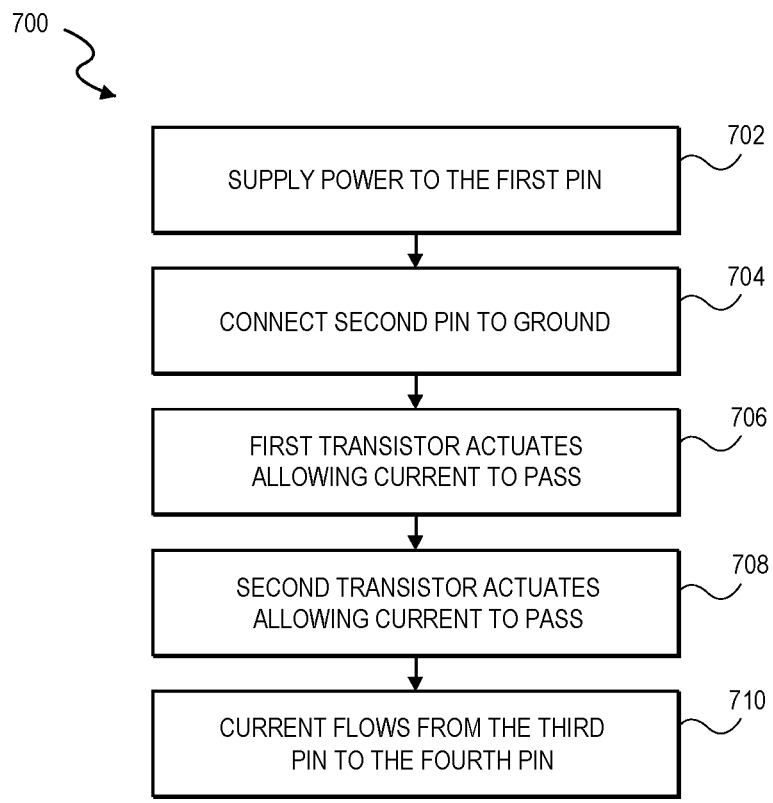
FIG. 7 depicts a flow diagram of a method of operation of a drop-in solid-state relay.

FIG. 7, depicts a method for controlling current from a power source to operational equipment by activating transistors in a drop-in solid-state relay generally referenced by the numeral 700. The method described in reference to the flow diagram 700 can be used in the circuits provided in FIGS. 3 and 4. At step 702, in some embodiments, a user may activate a switch that supplies a power to the first pin 302. The power may be supplied by any power source on the utility vehicle 100 or from a battery or may be an independent power source specifically designated for the Power Distribution Module (PDM) 108.

At step 704, the circuit is connected to ground at the second pin 304 allowing the current to flow through and supplying a voltage to the first transistor 310. Requiring the second pin 304 be satisfied with ground provides a safety interlock that is not typical in the art. Further ground-side switching is possible in this configuration as described in embodiments above.

At step 706, the first transistor 310 actuates based on the voltage and allows the current to flow to the second transistor 312. Again, the ground must be connected at the second pin 304. This allows a relatively low amount of current to be supplied at the first pin 302. The actuation of the first transistor 310 may only require a low amount of current. This separates the user from the high power that may be provided at third pin 306. In some embodiments, the first transistor may be an N-channel MOSFET.

At step 708, the second transistor 312 is actuated based on the voltage when the first transistor 310 is actuated. The second transistor 312 may be a P-channel MOSFET or, in some embodiments, two N- or P-channel FETs. Actuation of the second transistor 312 allows current to flow from the third pin 306 to the fourth pin 308 powering the operational equipment 110 at the fourth pin 308.

At step 710, current flows from the third pin 306 to the fourth pin 308. In some embodiments, the power source at the third pin 306 is the same power source at the first pin 302. In some embodiments, the power source and the power level are different between the first pin 302 and the third pin 306.

Figure 8:
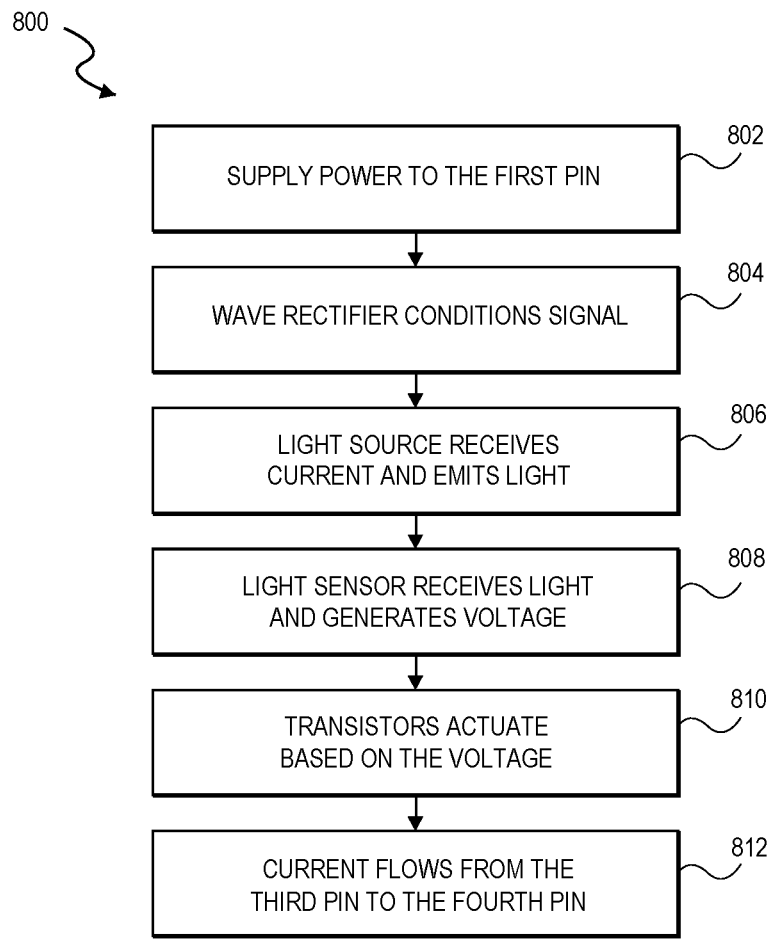
FIG. 8 depicts a flow diagram of a method of operation of a drop-in solid-state relay.

FIG. 8 depicts a flow diagram for a method of controlling current from a power source to operational equipment by activating transistors in a drop-in solid-state relay generally referenced by the numeral 800. The method described in reference to the flow diagram 800 can be used in the circuits provided in FIGS. 5 and 6. At step 802 power is supplied at the first pin 508. The power source may be any power source described in embodiments above. The pin layout for the drop-in solid-state relay 202 may be for any equipment as described above. Specifically, the pin layout may be arranged for automotive Form Factor A relay plugs.

At step 804 the full wave rectifier 512 and, in some embodiments, the ideal diode full wave rectifier 600 provides a direct current output from the direct or alternating power source provided in step 802. In some embodiments, the power source for the input stage 502 may be an alternator generating alternating current. As the optical isolator 515 in the output driver stage 504, in some embodiments, includes a diode for emitting light to drive the output stage 506, the working current for the output driver stage 504 may be direct current. The full wave rectifier 512 converts the alternating current to direct current for supplying direct current to the output driver stage 504. In some embodiments, the full wave rectifier 512 also serves to normalize the polarity of a direct current signal. This allows the optical isolator 515 to constantly drive the output stage 506 while the current is supplied.

At step 806, the current passes to the output drive stage comprising of the optical isolator 515. The optical isolator 515 comprises at least a light source 520 and a light sensor 522. The sensor 522 generates a voltage based on the energy detected from the light source 520. In some embodiments, the light passes through a transparent or translucent dielectric barrier 536 disposed between the light source 520 and the sensor 522. The optical isolator 515 passes energy from the input stage 502 to the output stage 506 while electrically insulating the input stage 502 from the potential high voltage required to operate the operational equipment 110. This isolation from the output stage 506 to the input stage 502 isolates the electrical equipment of the input stage 502 from potentially damaging voltage spikes.

At step 808, the sensor 522 receives the light and generates a voltage from the energy received from the light. In some embodiments, the sensor 522 is a photovoltaic sensor that generates a voltage when energy is received in the form of light. As described above, the voltage generated at the sensor 522 is in electrical communication with the output stage 506 transistors.

At step 810, the first transistor 524 and the second transistor 526 actuate based on the voltage. In some embodiments, the first transistor 524 and the second transistor 526 actuate based on voltage and are Field-Effect Transistors (FET). Further, in some embodiment, the transistors are Metal-Oxide-Semiconductor Field-Effect Transistors (MOSFET) and may also be Gallium Nitride Field-Effect Transistors (GaN FET). The first transistor 524 and the second transistor 526 may be of the same type or different type transistors. In some embodiments, the first transistor 524 and the second transistor 526 are either N- or P-channel transistors and may be arranged in any manner. As depicted in FIGS. 4 and 5 described above, the transistor may be N-type or NPN and P-type or PNP. As shown in FIG. 5, both transistors may be N-type or NPN. However, in some embodiments, both transistors may be P-type or PNP.

At step 812, current is transferred from the third pin 528 to the fourth pin 530 to power the operational equipment 110. In some embodiments, the current can be transferred from the third pin 528 to the fourth pin 530. The power received at the third pin 528 may be provided by any motor or generator and may provide sufficient power to operate the operational equipment 110 at the fourth pin 530.

The insulating components and methods of use of the circuits and the components comprising the circuits provided herein may be used individually or in any combination. The components and methods may also be used with the utility vehicle 100, automotive, or any other machinery that requires power distribution. Some embodiments, of the circuits described herein, may be for drop-in replacement for automotive Form Factor A relays.

It should be appreciated that, while the above disclosure has been generally directed to the field of aerial devices, embodiments of the invention may be directed to other fields and uses. For example, embodiments of the invention may be used in stationary cranes, antennas, digger derricks, and other equipment that may come into contact or used in close proximity to high voltage electrically charged components.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A circuit of a drop-in solid-state relay for transferring electrical energy across a gap to supply power from an input to an output, the circuit comprising:
   a first pin connected to a first power source;
   a second pin connected to ground;
   a first transistor disposed between the first pin and the second pin;

a full wave rectifier disposed between the first pin and the second pin;
a third pin;
a fourth pin;
a second transistor disposed between the third pin and the fourth pin; and
an optical isolator disposed between the first transistor and the second transistor,
wherein the optical isolator comprises a light source disposed between the first pin and the second pin and a sensor disposed between the third pin and the fourth pin,
wherein the light source emits a light when the current is received from the first transistor,
wherein the sensor generates electrical energy upon receiving the light from the light source, and
wherein the second transistor is configured to allow a current to pass from the third pin to the fourth pin when the electrical energy is received from the sensor.

2. The circuit of claim 1, wherein the full wave rectifier comprises a plurality of diodes configured to provide a constant current to the sensor.

3. The circuit of claim 1, wherein the full wave rectifier comprises a plurality of transistors configured to provide a constant current to the sensor.

4. The circuit of claim 1, wherein the first transistor and the second transistor are N-type MOSFETs.

5. The circuit of claim 1, wherein the first pin, the second pin, the third pin, and the fourth pin, are configured such that the circuit is implemented in a vehicle.

6. The circuit of claim 1, further comprising at least one other transistor disposed between the third pin and the fourth pin and configured to allow a current to pass from the third pin to the fourth pin when the electrical energy is detected from the sensor.

7. The circuit of claim 1,
wherein the light source is at least one of a Light Emitting Diode (LED) and a lamp, and
wherein the sensor is at least one of a photoresistor, at least one photodiode, an N-channel metal-oxide field-effect transistor, and a thyristor.

8. The circuit of claim 7, wherein the first pin, the second pin, the third pin, and the fourth pin, are configured such that the circuit is implemented in a vehicle.

9. An optically-isolated circuit of a drop-in solid-state relay for changing the state of a plurality of transistors and sending power from an input stage to an output driver stage, the circuit comprising:
an input stage comprising:
a first pin connected to a first power source;
a second pin connected to ground; and
a full wave rectifier;
an output stage comprising:
a third pin connected to a second power source;
a fourth pin connected to an output; and
the plurality of transistors;
an optical isolator disposed between the input stage and the output stage comprising:
a light source disposed between the first pin and the second pin of the input stage; and
a sensor disposed between the third pin and the fourth pin and separated from the light source by a space,
wherein the light source emits a light when a current is received from the first power source via the full wave rectifier,
wherein the sensor receives the light and generates a voltage when the light is received;
wherein the plurality of transistors allow the current to pass from the third pin to the fourth pin based on the voltage generated by the sensor.

10. The circuit of claim 9,
wherein the light source is at least one of a light emitting diode and a lamp, and
wherein the sensor is at least one of a photodiode, a photoresistor, an N-channel metal-oxide field-effect transistor, and a thyristor.

11. The circuit of claim 9, further comprising a first transistor and a second transistor of the plurality of transistors,
wherein the first transistor and the second transistor are NPN MOSFETs.

12. The circuit of claim 9, further comprising four transistors arranged to create the full wave rectifier at the input stage and at least one transient-suppression diode at the output stage.

13. The circuit of claim 12, wherein the four transistors are a combination of two enhancement insulated gate FETs and two depletion insulated gate FETs.

14. A method for actuating at least one transistor of a circuit of a drop-in solid-state relay for sending power from an input pin to an output pin, the method comprising the steps of:
receiving a first current from a power source;
generating a constant current from the power source by a full wave rectifier;
illuminating a light source to emit a light using the constant current;
detecting the light from the light source with a light sensor across a gap between the light source and the light sensor;
generating a voltage by the light sensor based on the detected light;
actuating the at least one transistor based on the voltage; and
sending a second current from the input pin to the output pin.

15. The method of claim 14,
wherein the light source is at least one of a light emitting diode and a lamp, and
wherein the sensor is at least one of a photodiode, a photoresistor, an N-channel metal-oxide field-effect transistor, and a thyristor.

16. The method of claim 15, further comprising the step of conditioning the first current from alternating current to direct current using a combination of diodes or transistors.

17. The method of claim 15, further comprising the step of normalizing the polarity of a direct current using a combination of diodes or resistors.

18. The method of claim 14, wherein the at least one transistor is at least one of an NPN MOSFET and a PNP MOSFET.

19. The method of claim 18, wherein the circuit comprises four pins arranged to fit a vehicle.

20. The method of claim 14,
wherein the at least one transistor comprises a first transistor and a second transistor, and
wherein the first transistor and the second transistor are both NPN MOSFETs.

* * * * *